INVENTOR
PHILIP BASSE

INVENTOR
PHILIP BASSE

INVENTOR
PHILIP BASSE

United States Patent Office 3,509,484
Patented Apr. 28, 1970

3,509,484

DIGITAL FREQUENCY COUNTING AND DISPLAY APPARATUS FOR TUNABLE WIDE BAND SIGNAL GENERATORS

Philip Basse, Freeport, N.Y., assignor to Slant-Fin Corp., a corporation of New York Filed Mar. 25, 1968, Ser. No. 715,915
Int. Cl. G01r *23/10;* H03b *3/04;* H03k *21/18*
U.S. Cl. 331—44 11 Claims

ABSTRACT OF THE DISCLOSURE

A signal generator employs an oscillator which is continuously tuneable over a wide band of frequencies. Tuning is accomplished by means of a band switch serving to distribute said wide band of frequency into a plurality of narrow bands. Digital logic circuitry coupled to the oscillator and controlled in operation by the above band select switch converts the oscillator frequency into a number of pulses always having a fixed number of significant digits representative of the oscillator's frequency.

BACKGROUND OF THE INVENTION

Figure 1:
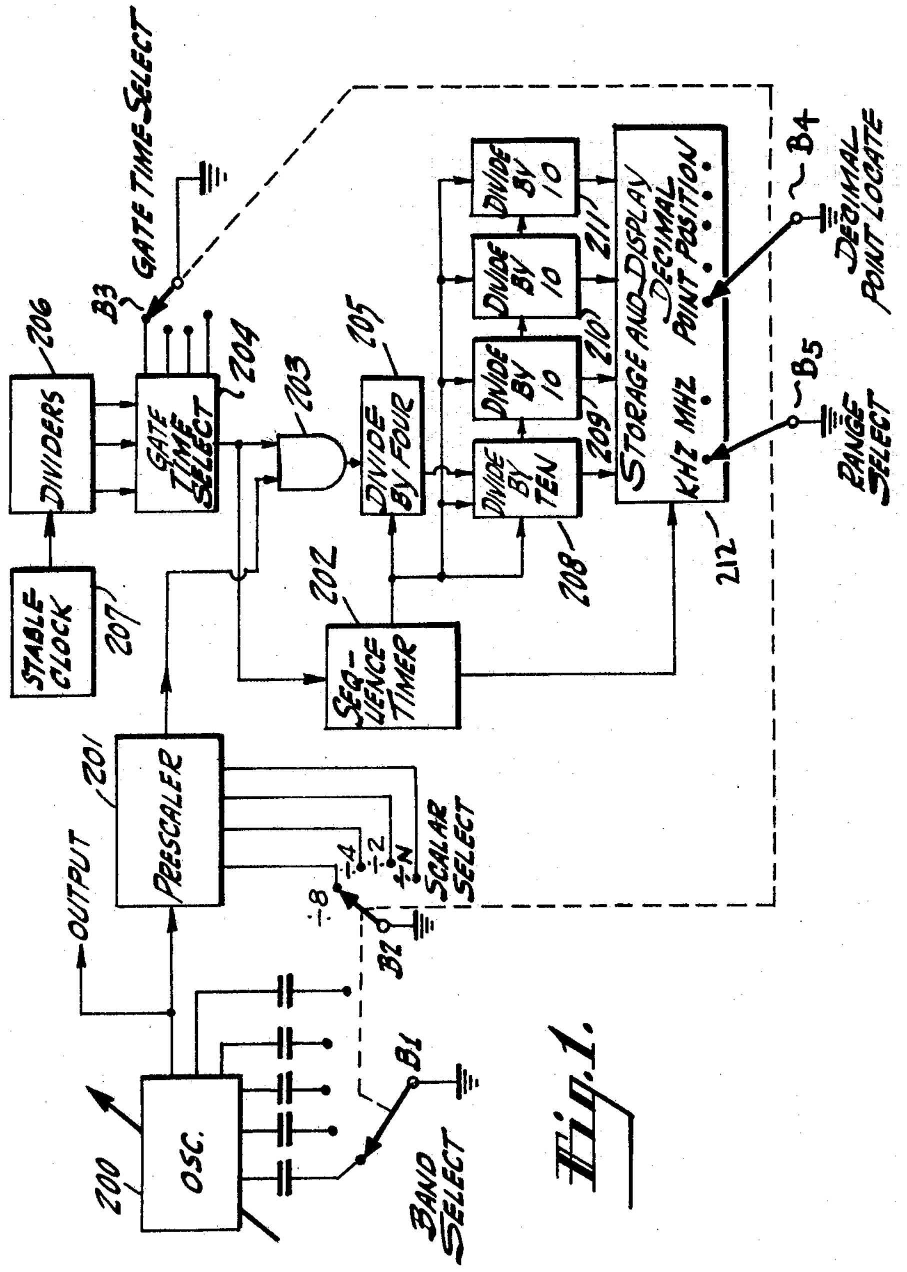

This invention relates to signal frequency sources and more particularly to an improved frequency signal generator incorporating simple readout and control means.

Presently there exist many various types of frequency source or signal generators for testing, calibrating and, in general, for laboratory or field use. Certain of these generators are capable of providing a wide range of sinusoidal or other types of waveshapes having a repetition rate or a frequency which is variable. Many of these generators are operative over a wide range of frequencies, as decades or octaves, and can be tuned to provide one of a plurality of such desired frequencies. In most instances such devices rely on accurately calibrated dials or other mechanical readout devices to enable the user to set the generator to a desired frequency output. In turn these mechanical devices have to be accurately calibrated for production purposes so that a common dial format can be used on a plurality of signal generators of the same type. In order to mass produce such generators the manufacturer has to take care in that the dial, which is accurately calibrated and machined, tracks with the production unit and hence accurately corresponds in its position or reading with the actual frequency provided by the generator controlled thereby.

Where the generator is one capable of providing a wide range of frequencies controlled by a band select switch, coarse and fine tuning dials which determine the frequency within a band must be calibrated to correspond with all the ranges of frequencies accommodated by the switching of the oscillator or generator. This requirement further complicates the dial calibration and in many instances includes various tuning devices in the generator to allow for dial tracking. Furthermore due to mechanical coupling of the dials to the generator and associated tolerances, the user can still not be sure that the frequency he sets the generator to actually corresponds to that frequency generated. Therefore elaborate tests and maintenance checks are performed, at specified intervals, on the generator.

Therefore as the generator is capable of providing a very wide range of frequencies, multiple dials or tuning adjustments are provided which further complicate production and manufacturing techniques and further serve to make tracking of the generator, with such additional controls, less accurate and relatively difficult.

It is therefore an object of the present invention to provide an improved wide frequency range signal generator having an accurate and consistently determined output frequency indication.

A further object is to provide a frequency generator which is continuously tuned and easily set to a desired output frequency while eliminating the need for accurately calibrated dial controls.

These and other objects of the present invention are accomplished in a preferred embodiment wherein a frequency generator is capable of being continuously tuned over a broad range of frequencies and is further controlled by a band switch used to determine the generator's tuning over said broad range by selecting certain frequency bands within the range. Because of the wide range of frequencies that the generator can accommodate the coarse and fine frequency controls associated therewith cannot be used to determine, with any precision, the output frequency. In this manner the band switch is utilized to control a digital display which in turn displays the output frequency directly by means of visual or other format. The display logic which is a counter followed by a prescaler is further controlled by the band switch and use is made of the setting of the band switch to facilitate the requirements of the logic while further assuring an accurate readout of the generator's output frequency. In particular, the band switch serves to control the division rate of the prescaler, the gating of the counter, the decimal point selection of the display and the primary magnitude of the output frequency such as kilohertz, kHz or megahertz, mHz.

Figure 2A:
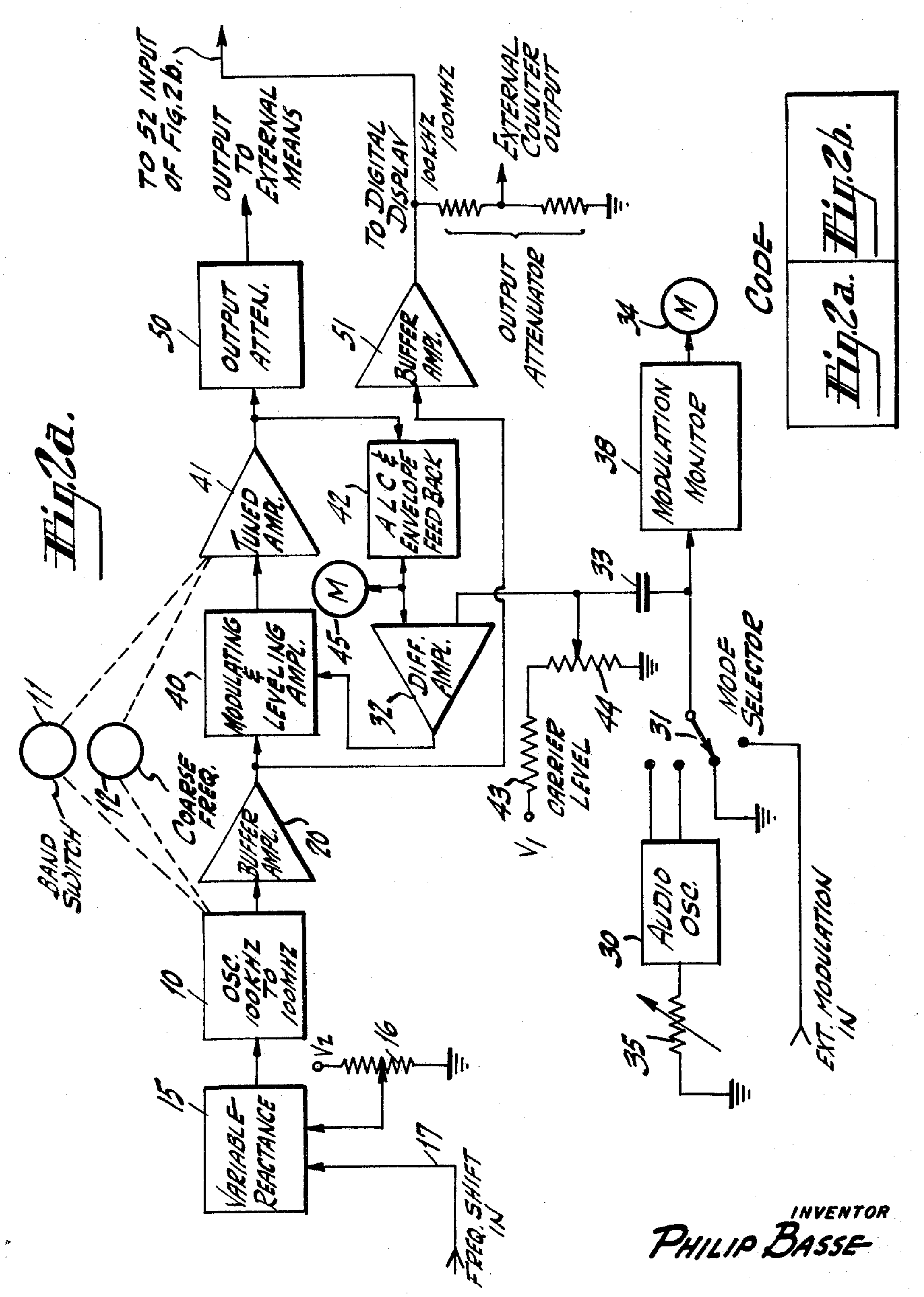
Figure 2B:
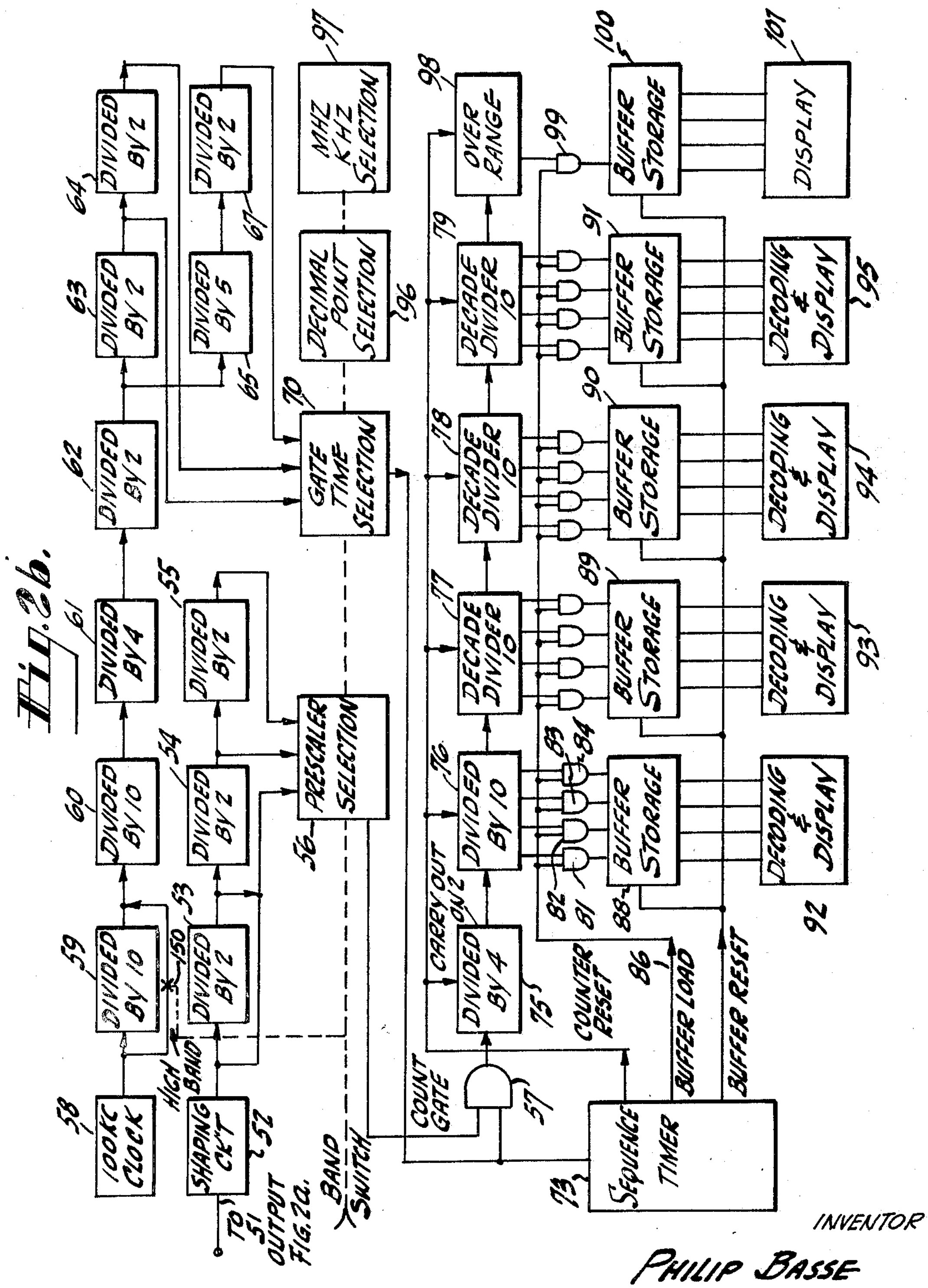

Additional objects and advantages of the present invention will become apparent upon consideration of the following description when taken in conjunction with the accompanying drawings in which:

FIGURE 1 is a block diagram of a signal generator according to this invention; and FIGURE 2 is shown as FIGURES 2*a* and 2*b* and is a detailed block diagram of another embodiment of a signal generator according to this invention.

Referring now to FIGURE 1, there is shown an oscillator 200 capable of being continuously tuned over a wide range of frequencies. Oscillators capable of exhibiting wide frequency ranges are known in the art. As such, one may cover the range of frequencies desired, by switching a different tuned circuit or reactive component for each smaller frequency band, utilized to cover the desired wide range, in series or in shunt with the inherent frequency determining networks of the oscillator 200. In this manner shown, by way of example, coupled to the oscillator 200 is a plurality of capacitors, which may be selected by means of a band switch B1 to obtain the desired range. An arrow emanates from oscillator 200 to indicate that it is further capable of being tuned continuously over the range determined by the selection of any one of the capacitors. The tuning within the range, determined by the capacitors, is generally indicated as a coarse frequency control and accomplished by certain prior art techniques using a calibrated dial. The selection of a desired capacitor by means of bandswitch B1 is usually accomplished by a rotary or detented type switch and as such is referred to as a band selector switch. Furthermore, other dials as fine frequency adjust and so on may be utilized to obtain smaller frequency increments within a band. Such fine frequency adjusts in the prior art are usually calibrated dials or other closely calibrated means. For ease of explanation a band switch section such as B1 and so on will appear coupled between ground and a selectable terminal, indicating selection of an appropriate function.

Coupled to the oscillator 200 there is shown an output lead which may be coupled to external means for use therein. The oscillator 200 also has its output coupled to a pre-scaler 201, which functions to divide the oscillator frequency by a selectable integer, which integer is selected according to the setting of the same bandswitch as utilized to select a desired capacitor or reactive network determining the band of the oscillator 200. In this manner a switch B2 is shown coupled between a source of reference potential as ground and a group of leads emanating from the pre-scaler 201 and labelled as divide by 8, 4, 2 and N.

The pre-scaler 201 may be a known type of binary counter adapted to provide a divided frequency at its output for a train of pulses at its input. Such devices as binary counters are capable of accomplishing a given division or counting rate relatively independent of the frequency of the incoming wave. Ring counters, shift registers and so on may be utilized as well for pre-scaler 201.

The output of pre-scaler 201 is coupled to one input of a two input "and" gate 203, having its output coupled to the input of a fixed divide by four circuit 205. The divider 205 may also be of the binary type and hence employ two flip-flop stages each accomplishing a division of two. The other input to "and gate" 203 is derived from a gate time select circuit 204, which produces a timing gate having a repetition rate selected by the above noted bandswitch. Therefore a plurality of leads are shown coupled to the gate time select 204 each of which may be selected by the bandswitch B3. The waveshapes for the gate time select 204 are derived from a stable clock 207 whose output is divided by a specified amount by means of a divider 206. The output of the gate time select 204 besides being coupled to the input of and gate 203 is also coupled to an input of a sequence timer 202.

The sequence timer 202 is coupled to an input of the divide by four, 205 whose output is coupled to the first decade stage 208 of a chain of decade counters 208 to 211. Each counter 208 to 211, including the divide by four 205 is controlled by the sequence timer 202, as will be explained subsequently. The output of each decade counter 208 to 211 is coupled to an input of a storage and display module 212, which has a decoding matrix and an associated display. In this manner the state of each decade stage 208 to 211 can be decoded and presented by means of the storage and display device 212 as, in this example, a 4 digit decimal number. The display enable and the decode matrix are also under control of the sequence timer 202.

Shown included in the storage and display circuit 212 is a kilohertz, megahertz switch B5 and a decimal point position switch B4, both of which are coupled to and operate with the bandswitch described above.

From the above description of the coupling of FIGURE 1 it is seen that the oscillator 200, the pre-scaler 201, the gate time select 204 and the range and decimal point location are all under control of the band select switch shown as having separate sections B1, B2, B3, B4 and B5. It is of course understood that such switching can be implemented in other ways utilizing transistors, diodes and so on, which may not require separate detents or contacts.

The operation of the circuitry described above will now be explained by way of an example. Assume that the oscillator 200 is providing a desired frequency of 900,000 Hz. 900 kHz. This would correspond to the band select switch B1 coupling one capacitor to the oscillator 200 which provides the range containing 900,000 Hz. The fine tuning adjust position would be selected to accurately provide 900,000 Hz. Simultaneously the pre-scaler 201 would be switched at this band position to provide a divide by two and therefore produce a 450,000 Hz. waveshape at its output. This frequency of 450,000 Hz. is coupled to one input of the gate 203. Now assume that the stable clock 207 is a crystal oscillator oscillating at a frequency of 100,000 Hz. or 100 kHz. This frequenecy is in turn divided by a group of dividers 206 to provide a plurality of related timing pulse trains to inputs of the gate time select circuit 204. The gate select band switch counterpart B3 simultaneously selects the waveshape providing a pulse train of 80 milliseconds to be coupled to the other input of gate 203. The waveshape of 80 milliseconds is obtained by dividing the 100,000 Hz. stable clock frequency by 8000. This corresponds to a frequency of 100,000 Hz. divided by 8000 or 12.5 Hz. The reciprocal of 12.5 Hz. is equivalent to the time of 80 milliseconds. With the above inputs, gate 203 will gate 80 milliseconds of the 450,000 Hz. signal. Since 450,000 Hz. corresponds to 450 pulses a millisecond, therefore 36,000 pulses are gated by or passed through gate 203. The sequence timer 202 which is now activated by the 80 millisecond pulse train performs the following function. It detects the edge of the 80 millisecond pulse train of the polarity which serves to enable gate 203. Upon detection of this edge the sequence timer 202 enables the decade counter chain 208 to 211 and the divide by four 205, to cause these modules to operate. The input to the divide by four 205 of 36,000 pulses is divided to 9000 pulses at its output. The decade counters 208 to 211 are capable of counting to 9999 and therefore will follow the count of 9000 pulses. At the end of the 80 millisecond interval the sequence timer detects the disabling edge of the 80 millisecond pulse train and activates the storage and display module 212. This unit serves to decode and display the contents of the decade counters 208 and 211. Therefore at this time the display indicates 9000. However because the bandswitch also controls the decimal point location and the range select indications, (via B4 and B5) the actual display indicates 900.0 kHz. This of course, corresponds to the actual frequency of the oscillator 200.

Therefore because of the rapid response of the logic any setting of the oscillator 200, over a relatively wide range of frequencies is immediately available as a visual display to an operator. Hence the signal generator shown does not require accurately calibrated dials as the oscillator 200 frequency is constantly monitored and displayed due to the unique control of the band select switch as described above. Furthermore, it will be shown that the total capability of the display, in this case of four digits, is always utilized for all frequencies in all oscillator bands.

It should also be apparent from FIGURE 1, that to further extend the range of the signal generator a suitable prior art mixing technique could be employed before the pre-scaler 201. In this manner, for example, the frequency of the oscillator 200 may be converted by means of a second stable oscillator which is also under control of the band switch to provide a lower frequency and then again by proper selection of the compatible gate time waveshape and pre-scaler factor the oscillator frequency could be read directly. for example assume the frequency of oscillator 200 was 9,000,000 Hz. or 9 mHz. If this output was applied to one input of a mixer and another oscillator were controlled to oscillate at a frequency of 8.1 mHz. then the difference frequency of 9 mHz.—8.1 mHz. or 900,000 Hz. would be selected by means of a filter and so on. This frequency would be coupled to the pre-scaler 201, the circuitry described above would cause the storage and display to read 9000 again. But in this case the decimal location under control of the bandswitch B4 and the range select B5 would give a reading of 9.000 mHz.

Referring to FIGURE 2, there is shown a wideband oscillator 10, which may, for example, be a Hartley, Colpitts or some other type of relatively stable frequency generator capable of being tuned or controlled over a wide range of frequencies. For purposes of explanation, the range of the wide band oscillator 10, may be from 100 kHz. to 100 mHz., which range is covered by octave steps or multiples thereof. In this manner a desired band is selected by the operator by means of the band switch 11 shown mechanically coupled to the oscillator 10. Band switch 11, for example, may function to physically switch in or remove a reactive component associated with the frequency determining circuit of the oscillator 10 to enable operation over the desired band step. A further frequency control 12 is coupled to the oscillator 10 to enable a relatively coarse continuous selection of any one of a plurality of frequencies contained within the octave band step. The control 12 is also shown mechanically coupled to and as such may serve to vary a mechanically variable reactance, as an air dielectric capacitor, a slug tuned coil or other device associated with the frequency determining network of the oscillator 10. To allow fine control of the oscillator 10 setting there is shown electrically coupled thereto a variable reactance device 15, which may, for example, be a varactor diode, a saturable reactor or some other variable reactive device. Such devices as 15 have a reactance whose magnitude is voltage or current dependent. In this manner the variable reactance 15 appears across appropriate terminals of the oscillator 10 to further provide finer control of its frequency. The magnitude of the reactance 15 so utililized, is determined by the setting of the variable resistor 16, labeled as *Fine Freq.*, coupled between a source of potential $V_2$ and ground. For external fine frequency control of the oscillator 10, or for frequency modulation, thereof, the magnitude of the variable reactance 15 may be controlled by an external signal coupled thereto by means of the "FREQ. SHIFT IN" lead 17 (FREQUENCY SHIFT INPUT).

The output of oscillator 10 is coupled to a buffer amplifier 20, where its output frequency signal is amplified and isolated. As such amplifier 20 may comprise a suitable number of conventional stages of amplification followed and terminated by emitter followers; or may comprise operational amplifiers, which may both serve to present a high input impedance to the oscillator 10, so as not to load it or affect its frequency. The buffer amplifier 20 further serves to provide a low output impedance at its output to enable easy driivng and isolation of additional circuitry.

Also shown in FIGURE 2 is an audio tone oscillator 30, which is of a conventional and well known design, and is capable of supplying two or more different frequencies, which may, for example, be 400 Hz. and 1 kHz. Each frequency is adjustable in amplitude, shown for example, by means of variable resistor 35. Any one of the output frequencies from the audio oscillator 30 can be coupled via the mode selector switch 31, to an input of a differential amplifier 32. This coupling is accomplished by connecting the arm of the mode selector switch 31 through a capacitor 33 to an input of the differential amplifier 32. The mode selector switch 31 has two other positions, associated therewith, which serve to connect a source of external signal designated as "EXT MODULATION IN." In another position for continuous wave operation the mode switch 31's arm is connected to ground.

The arm of the mode switch 31 is also coupled to a modulation monitor 38 whose output is coupled to a meter 34, designated as M (modulation depth). The modulation monitor 38 may, for example, be a peak detector producing a D.C. level at its output corresponding to the A.C. magnitude of the output of the audio oscillator 30 or the signal present on the arm of the mode switch 31. The meter 34 is of a conventional and well known type and reads in accordance with the direct current output from the modulation monitor 38. The differential amplifier 32 has its output coupled to an input of a modulating and leveling amplifier 40, which has another input coupled to the output of the buffer amplifier 20. The function of the modulating and leveling amplifier 40 is twofold. First the amplifier 40 responds to the output of the oscillator 10 via buffer 20 and to any modulation frequency from the audio oscillator 30 to produce an amplitude modulated output, where the carrier is determined by the output of the oscillator 10 and the sideband displacement by the frequency or output of the audio oscillator 30. Amplitude modulators for performing such functions are well known in the art. Secondly, the modulating and leveling amplifier 40 can maintain the signal level at its output at a desired constant amplitude. This is necessary to compensate for any variations in the output obtained from the buffer amplifier 20 due to a decrease or increase of amplitude from the oscillator 10 when operating over its wide frequency range. The maintenance of the output's amplitude is accomplished in the following manner. The output of the modulation and leveling amplifier 40 is coupled to a tuned amplifier 41, whose bandpass is also controlled by the settings of the band switch 11 and the coarse frequency control switch 12. Examples of such tuned amplifiers are well known in the art and for example, reference is made to chapters 12 and 13 of "Electronic and Radio Engineering" by F. E. Terman, McGraw-Hill 1955. Such tuned amplifiers as 41, may employ transistors or be integrated circuits, many examples of which can be found in the prior art. The output of amplifier 41 is coupled to the input of an A.L.C. and envelope feed back circuit 42, whose output is coupled to the other input of the differential amplifier 32. The A.L.C. or automatic level control and envelope feedback circuit 32 functions as follows: assume that the audio oscillator 30 is switched out of the circuit by placing the mode selector switch in the C. W. position, corresponding to grounding of arm 31. In this case the output from the modulation and leveling amplifier 40 is a continuous unmodulated frequency waveshape determined by the setting of oscillator 10. The amplitude of the waveshape, in turn, provides a certain level to the A.L.C. and envelope feedback circuit 42.

The ALC circuit 42 by means of a voltage comparator or a rectifying circuit produces a D.C. voltage or current proportional to this amplitude at its output, which is coupled to one input of the differential amplifier 32. The other input of the differential amplifier 32 is set at a level determined by the voltage impressed thereon from the divider, labelled "Carrier Level," and comprising resistors 43 and 44, coupled between a potential source $V_1$ and ground. The differential amplifier 32 then produces a D.C. voltage at its output proportional to the difference of the two D.C. levels at its inputs. This output voltage of the differential amplifier 32, is then used to control the gain or level of the amplifier 40, thus serving to maintain it at a desired constant value. The A.L.C. circuit 42, described, monitors this level assuring it stays constant, within prescribed limits, over the entire range of the oscillator 10. Since the output of the ALC and envelope feedback circuit 42 is proportional to the amplitude of the output of the oscillator 10, its output can be monitored to give an indication of the oscillator output level and is therefore shown coupled to a meter 45. For the case where the audio oscillator 30 is coupled to the input of the differential amplifier 32 and is therefore providing 400 or 1,000 Hz. thereat, the ALC and envelope feedback circuit 42 responds to the modulation envelope of the amplitude modulated waveshape and again provides at its output a control voltage coupled to the input of the differential amplifier 32 which again acts to control the gain of an amplifier stage present in the modulation and leveling amplifier 40. In this manner one is assured of obtaining a relatively constant and predetermined amplitude from the output of the tuned amplifier 41. This output of amplifier 41 is then coupled to an output attenuator 50, which serves to provide an impedance match at its input for the tuned amplifier 41 and further provides a nominal output level for coupling the output signal frequency waveshape of the system described to any desired external means. Such external means may be any means conveniently tested by or used with a wide band generator, such as a receiver, filter and so on.

Thus far, the control and operation of the frequency generator has been described without reference to the means for determining the frequency at which it is operating. As previously indicated, because of the wide range of frequencies available, the talks of calibrating the coarse and fine frequency controls 12 and 16 becomes impractical and uneconomical. But in order for the generator described to be advantageously used, one has to assure that the frequency of the output or that frequency present at the attenuator 50 is accurately and precisely known. To accomplish this, the output of the buffer 20 is further coupled to the input of a buffer or isolating amplifier 51, which may be, an operational amplifier, emitter follower and so on.

The output of the buffer amplifier 51 is coupled to the input of a shaping circuit 52, which serves to limit and shape the sinusoidal waveshape to provide pulses or a square wave having the same repetition rate as said output frequency, but with faster rise and fall times. As such, the shaping circuit 52 may be a tunnel diode gate, Schmitt trigger or some other suitable and well known type of limiter and shaper. The output pulses provided by the shaping circuit 52 are distributed to the input of a divide by two circuit 53, which may be a conventional flip-flop or bistable multivibrator. In a similar manner the output of the divide by two, 53 is coupled to the input of another divide by two, 54 whose output feeds another such circuit 55. All of the aforementioned dividers can easily be implemented by the well known bistable multi, which by the very nature of its operation divides frequency by the factor of two. The chain of dividers 53, 54 and 55 can then divide any output of the generator, previously described, by a maximum factor of eight. In turn, the output of the shaper 52 and the output of each divider 53 to 55 are coupled to a separate input of a prescaler selection circuit 56. Selection circuit 56 may be a conventional gate circuit and as such is capable of decoding any one of the possible dividing states of the dividing chain to provide at its output a divide by one (corresponds to direct output frequency from the oscillator 10), two, three and so on to a divide by eight. The exact division ratio that the pre-scaler selection circuit 56 will provide is determined solely by the setting of the band select switch 11 which is also mechanically or otherwise coupled thereto.

The divided output obtained from the pre-scaler selection circuit 56 is applied to an input of a "count gate" 57, which may also be a conventional "and" gate. To further implement the present invention, there is shown a clock source 58, which may, for example, be a crystal oscillator having a relatively stable output frequency. This clock source 58, for the present example, is selected to be 100 kHz. The output of the clock source 58 is coupled to a chain of dividers 59, 60, 61 and 62, which perform an overall division of 800. These dividers can be binary types with feedback to provide the above division ratio. Examples of such dividers are well known, (see for example "Pulse and Digital Circuits," Millian & Taub, McGraw-Hill, chapter 11, entitled "Counting"). Circuits to provide division by factors of ten or less are well known in the art as evidence by the above cited text, and are not considered to be part of this invention. The decade divider 59 is shorted out by a contact 150 for certain high band frequency operation as will be subsequently described. Thus for the shorting out of divider 59 a division of 80 instead of 800 is performed by dividers 60, 61 and 62. The output of divider 62 in this case would be at a .8 msec. repetition rate. For the opened contact 150 and therefore the inclusion of divider 59, the output from the divide by two, 62 is the 100 kHz. clock divided by 800 which is equal to 125 Hz. or 8 milliseconds. In turn the output from the divider 62 is coupled to the input of a divide by two, 63 and a divide by five, 65. The output of divider 63 is coupled to the input of a divider 64, which performs a division of two and has its output coupled to an input of a Gate Time Selection circuit 70. The output of the divide by five 65, is coupled to the input of a divide by two, 67, whose output is coupled to another input of the Gate Time Selection circuit 70. A third input to the Gate Time Selection circuit 70 is supplied by the output of the divide by two circuit 63. In this manner the inputs to the Gate Time Selection circuit 70, are 16 millisecond pulses from the divider 63, 32 millisecond pulses from divider 64, and 80 millisecond pulses from divider 67. When the contact 150 shorts out the divide by ten, 59 these values become 1.6 milliseconds, 3.2 milliseconds, and 8 milliseconds respectively at the outputs of dividers 63, 64 and 67. The selection of a desired group or combination of such pulses from the gate time selection circuit 70 is again determined by means of the band switch 11, which is mechanically or otherwise coupled thereto.

The gate time selection circuit 70 may be a selective "OR" gate and can pass any one of the above pulse trains obtained from dividing the clock source, 58, available at its output due to the appropriate setting of the band switch 11. The output of the Gate Time Selection circuit 70 is coupled to the input of a Sequence Timer circuit 73, which serves to control a decimal counter, as will be described subsequently, and to the other input of the count gate 57. The output of the count gate 57 is coupled to a divide by four circuit 75, whose output in turn feeds a decade counter 76. The output of decade counter 76 feeds an input of a second decade counter 77, which feeds decade counter 78 followed by decade counter 79 having its input coupled thereto. Each of the above decade counters as 76 to 79 may again be binary types and such counters are presently in widespread use and can even be purchased as prefabricated units as integrated circuits and so on. Each decade counter such as 76 to 79 in turn feeds a group of four buffer gates, each one of which is coupled to a respective binary stage in the decade counter. In this manner each stage of the decade counter 76 feeds one input of gates 81, 82, 83 and 84. Since four binary stages are required to count or divide by ten, each input to the gate represents the state of each of the four stages. In a similar manner each of the other above mentioned decade counters, 77 to 79 is coupled to four similar gates. The other input of each of these buffer gates, as 81 to 84 are coupled to a buffer load bus 86 whose condition is determined by the sequence timer 73. The output of each buffer gate as 81 to 84 are respectively coupled to an input of a buffer storage for example, by four bistable devices, which serve to hold and store the condition of each of the decade counters. Reset of these buffer storage circuits is determined by the sequence timer 73. In like manner, then each decade counter 76 to 79 has associated therewith an individual buffer storage circuit 88, 89, 90 and 91 respectively, all of which are resettable and activatable by the sequence timer 73. In turn each buffer storage circuit 88 to 91, has associated therewith a decoding and display circuit 92, 93, 94 and 95, respectively. These decoding and display circuits 92 to 95, may be conventional "NIXIE" type displays together with a binary and decimal decoding matrix, consisting of diodes, transistors and so on. In this manner a visual display is available and a direct reading of frequency of the generator is obtainable for any setting thereof. Other suitable examples of the decoding and display units 92 to 95 may be electroluminescent devices, conventional bulbs and so on.

For further ease of reading frequency the display panel associated with such a generator includes a decimal point selector 96, under control of the band switch 11 and a broad frequency range indicator or a megahertz or kilohertz selection display 97, also under control of the band selection switch 11. Included herein is a "over range" circuit 98 which has its input coupled to the decade counter 79. This over range circuit 98 feeds an input of a "and" gate 99 whose other input is coupled to the buffer load bus 86 controlled by the sequence timer 73. Gate 99 has an output coupled to a buffer storage circuit 100, which in turn feeds an associated display and decoding unit 101. For a clear understanding of the display unit and the relationship of the timing involved in this generator, an example, will be presented to show operation. Assume then that it is desired to operate the generator so as to provide at the output of the attenuator 50 a signal whose frequency is to be 1,100,000 Hz. or 1.100,000 mHz. The operations are as follows. The operator sets band switch 11 to the octave range including this frequency which may for example, be indicated as 1 mHz. to 2 mHz. This operation in turn causes oscillator 10 to oscillate somewhere within this octave step. Simultaneously the amplifier 41 is tuned to provide maximum selectivity and amplification over the above octave step (1 mHz. to 2 mHz.). The setting of the band switch 11 further causes the pre-scaler 56 to provide the divided by four waveshape at its output, while further causing the gate time selection circuit 70 to provide the divided 16 millisecond clock obtained from the output of divider 63 coupling it to the count gate 57. Setting of the band select switch further sets the decimal point to correspond to the position of 1.100,000 and the mHz., kHz. selection circuit 97 to be placed in the mHz. setting. Assume now that by operating the band selection switch 11, and thus providing the above described conditions, the operator does not touch the coarse or fine frequency controls and due to the prior settings of these, the oscillator 10 is producing the undesired frequency of 1,600,000 Hz. or 1.600,000 mHz. which is within the octave range of the band switch as set above.

In this case the pre-scaler 56 being set to provide a division by four provides at its output a square wave having a frequency of 1,600,000 Hz. divided by four or 400,000 Hz. or 400,000 pulses per second. Now due to the fact that the band selector switch 11 activated the Gate Time Selection circuit 70 to provide a 16 msec. clock, this clock in turn enables gate 57 to pass 16 milliseconds of pulses from the pre-scaler to the counter chain comprising the dividers 75 to 79. In this manner, due to a repetition rate of pulses from the pre-scaler 56 of 400,000 pulses per second, or 400 pulses per millisecond and due to the fact that the gate 57 is enabled for 16 milliseconds by the gating time selection circuit 70, the gate 57 provides at its output 16×400 or 6400 pulses in 16 milliseconds. The 6400 pulses are then divided by four by divider 75 to provide at its output 1600 pulses which are fed to the four decade stage counters 76 to 79. Simultaneously, with the above operation the sequence counter 73 operates as follows. The sequence timer 73 is also fed the 16 millisecond clock from the gate time selection circuit 70. It detects the leading edge of this clock which enables the counter gate 57 and removes the reset from all of the dividers 75, 76, 77, 78, 79 and 98, thereby allowing these counters to respond to the output of gate 57.

After the duration of 16 milliseconds the sequence timer detects the next edge of the 16 millisecond clock and enables the gates 81 and 84 and those others associated with each buffer storage circuit 88 to 91 and hence each decade counter 76 to 79. From the above it is noted that at this time the counters will have received 1600 pulses and hence the setting of each counter stage would correspond to 1600 pulses. In this manner stage 79 would read binary 0001, stage 78 would read binary 0110, stage 77 read 0000, and stage 76 reads 0000. These binary numbers would then be stored in the buffer flip-flops and decoded by the binary to decimal decode networks contained in the decoding and display circuits 92 to 95 to give a visual display of 1600 due to the conditions of the decade counters.

Now as previously mentioned, the decimal point has already been selected by the band switch 11 as has the broad frequency range selection and therefore for the above described settings the operator immediately sees 1,600 mHz. on the display. The activation of the display is of course continuous as the logic responds rapidly to the generator's setting. Of course, the sequence timer, 73, continually loads and erases the buffer storage and the display remains visible for any one setting of the generator. Hence the operator now sees that he is at 1.600 mHz. and not at the desired 1.100 mHz., he then proceeds to tune the oscillator 10 by means of the coarse frequency control 12 leaving the band select switch 10 alone. In this manner the new setting is immediately visible on the display panel.

By further adjusting the coarse and fine controls 12 and 16 the desired frequency of 1.100 mHz. appears on the display and will continue to so appear as long as desired. By the same technique of controlled prescaling and selecting the above counters time base, together with the decimal point and mHz., kHz. selection all by means of the band switch 11, the counter is always responding to a relatively low frequency input while providing a reading which actually corresponds to the output of the oscillator 10. In this manner one need not look to the setting of the coarse orw fine frequency controls, which need not be calibrated or relied on due to the visual display. Furthermore the band selector switch 11, may be a detented rotary type ganged switch and is merely used to select octaves or multiples thereof, which are easily obtainable from any conventional and known oscillator. Due to the fact that the input to the counters is always prescaled and low, they can be low frequency responding devices and hence are easily obtained and commercially economical.

The following table includes settings for the various modules described above necessary to obtain the correct display decimal representation of the frequency that the generator is tuned to.

| Freq. of Oscillator 10 | Bandswitch 11 sets prescaler selection 56 to divide by | Bandswitch 11 sets gate time selector 70 to provide |
|---|---|---|
| 100,000 Hz | 2 | 80 millisecond pulses. |
| 9,000,000 Hz | 4 | 16 millisecond pulses. |
| 90,000,000 Hz [1] | 8 | 3.2 millisecond pulses. |
| 100,000,000 Hz [1] | 8 | 3.2 millisecond pulses. |

[1] Bandswitch 11 shorts out divide by ten 59 via contact 150.

The function of the over range decade divider 98 is to allow the unit to read accurately for an end of scale position. Namely, suppose one desires to set the generator to 10,000,000 Hz. or 10 mHz. In this case this would correspond to setting the prescaler selection 56 to a divide by four and cause the Gate Time Selector 70 to provide a 16 milliscend pulse train for the high end of this particular band position of the band selector 11. Therefore 10,000,000 pulses per second divided by four gives 2,500,000 pulses per second or 2,500 pulses per millisecond. In 16 milliseconds, 40,000 pulses are passed by the count gate 57, the divide by four circuit 75 divides this to 10,000 pulses which are set in to the decade counters 76 to 79. However, since they are four in number the highest number they can read is 9999. If the frequency is 10,000, these stages will read 0000 but the over range stage 98 will read the one and this will be displayed via the gate 99 activated by the sequence timer 73, and indicated by display 101 activated from buffer storage 100. Hence the operator when seeing this over range indication flash on, will switch to the low end of the next scale. This scale will cause a prescaler divide by 8 and a 3.2 millisecond gate selection. By the above procedure one notes that this corresponds to 1,000 pulses gated to the the decade counters by means of the count gate 57 and the divide by four 75, and therefore the outputs of the decade counters 76, 77, 78 and 79 will cause the display units 92 to 95 to read 10.00 mHz.

It is understood for more accurate readings the Gate Time Selection unit could supply a different pulse train allowing the count gate to supply more pulses to the decade counters 76 to 79 and hence additional decade counters, not shown, will read to higher places and give an even more accurate designation of the frequency of oscillator 10. It is also seen from the above description that at all ranges and for all frequencies obtainable from oscillator 10, the full display is used. That is at all times the decoding and display units 92 to 95 are energized and utilized for the corresponding reading no matter what the frequency involved is.

What I claim is:

1. Apparatus for displaying the frequency of a band switched oscillator on a given display means capable of displaying, with an accuracy of the same given number of significant digits, independent of the band in which said frequency exists, comprising:

(a) first means coupled to said oscillator, for dividing the frequency thereof by a specified integer, according to said band,
(b) a source of relatively stable frequency,
(c) second means coupled to said source for dividing said stable frequency to provide a plurality of lower stable frequency signals, each defining a separate predetermined time period, one of which is selected according to said band,
(d) third means coupled to said first and second means responsive to said selected lower stable frequency signal and said divided oscillator signal frequency for providing a number of pulses at an output thereof during said selected predetermined time period and in accordance with said divided oscillator signal, whereby said number of pulses is always a measure of the oscillator's frequency, and
(e) logic means coupled to said output of third means for storing said number of pulses in digital form with said accuracy of the same number of given significant digits always determined according to said number of pulses, whereby said number of significant digits displayed is always the same independent of the frequency of said oscillator.

2. Apparatus for displaying the frequency of a band switched oscillator on a given fixed digit length display, said oscillator capable of being continuously tuned in frequency over the range of each of said bands, comprising, (a) scaling means coupled to said oscillator for dividing its frequency by one of a given number of integers selected according to said band,
(b) a plurality of relatively stable frequency sources each defining a separate predetermined time period one of which is selected according to said band,
(c) logic means coupled to said scaling means and said selected source of relatively stable frequency to provide at an output thereof a number of pulses for a duration determined by said selected predetermined time period and in accordance with said divided frequency, whereby said number of pulses is always a measure of said oscillator frequency, and
(d) means coupled to said output of said logic means responsive to said number of pulses for providing a digital representation thereof having an accuracy of the same given number of significant digits to exactly correspond with said fixed digit length display independent of the band in which said frequency exists.

3. A frequency generator comprising:

(a) tunable means for providing a signal whose frequency can be varied continuously,
(b) first means coupled to said tunable means for dividing said signal frequency by a selected one of plurality of different integers, said one integer being selected according to said signal frequency,
(c) second means for providing a frequency stabilized signal having a predetermined time period determined in accordance with said selected integer and therefore said signal frequency,
(d) logic means coupled to said first and second means responsive to said divided signal frequency and said stabilized signal for providing at an output thereof a number of pulses in accordance with said divided frequency and for a duration determined by said selected predetermined time period of said frequency stabilized signal, whereby said number of pulses is always a measure of said signal frequency, and
(e) means coupled to said output of said logic means and responsive to said number of pulses for storing in digital form a specified given number of digits indicative of said signal frequency, said specified number of digits always being the same, independent of said signal frequency.

4. A frequency generator comprising:

(a) tuneable means for providing a signal whose frequency may be varied continuously,
(b) first means coupled to said tuneable means for dividing said signal frequency by a selected one of a plurality of different integers, said one integer being selected according to said frequency signal,
(c) second means for providing a frequency stabilized signal having a predetermined time duration selected in accordance with said selected integer,
(d) logic means coupled to said first and second means responsive to said divided signal frequency and said frequency stabilized signal for providing at an output thereof a number of pulses in accordance with said divided frequency and for a duration determined by said frequency stabilized signal, whereby said number of pulses is always a measure of said signal frequency,
(e) fourth means coupled to said output of said logic means for dividing said number of pulses by a fixed integer independent of said signal frequency to provide a second number of pulses, and
(f) means coupled to said fourth means responsive to said second number of pulses for storing in digital form a specified given number of digits indicative of said signal frequency, said specified number of digits always being the same, independent of said signal frequency.

5. In combination, comprising:

(a) an oscillator capable of being continuously tuned over a plurality of frequency bands, each of which is determined by a suitable selected network,
(b) first means coupled to said oscillator for dividing any frequency contained within said plurality of frequency bands by an integer selected according to said band,
(c) second means for generating a plurality of fixed frequency timing waveshapes each having a separate predetermined time period selected in accordance with one of said frequency bands and said selected integer,
(d) indicating means capable of being activated for displaying a plurality of integers having a fixed number of significant digits within a specified range,
(e) logic means coupled to said first and second means responsive to said divided frequency and said selected timing waveshape to provide at an output thereof a number of pulses during said predetermined time period, in accordance with said divided frequency whereby said number of pulses is always a measure of said frequency of said oscillator, and
(f) means coupled to said indicating means and said logic means for activating said indicating means to display said number of pulses within said fixed number of significant digits.

6. In a signal generator of the type employing a variable oscillator capable of providing at its output any one of a wide band of frequencies by causing said oscillator to provide a plurality of specified narrower frequency bands encompassed within said wide band of frequencies, said narrow frequency bands selected by means of a selector switch having a plurality of positions each serving to affect the impedance in a frequency determining circuit included in said oscillator, the improvement therewith comprising:

(a) a programmable divider coupled to said oscillator's output and programmed by said selector switch for dividing any one of said frequencies from said oscillator by a given integer, (b) a source of relatively stable frequency oscillations, for providing a signal having a predetermined time duration, (c) first means controllable by said selector switch and responsive to said divided frequency output and said stable source signal for providing a number of pulses at an output thereof corresponding with the band selected by said switch, said number of pulses being determined by said predetermined time duration and in accordance with said divided frequency signal, (d) a counting circuit coupled to said first means and responsive to said number of pulses for providing at its output a decimal indication of said number, and (e) second means controllable by said selector switch and coupled to said counting circuit responsive to said decimal number for providing a visual display substantially corresponding to said any one of said frequencies.

7. A tunable oscillator selectively operable at a variable frequency within a given number of predetermined frequency bands, each of which is selectable by means of a band selector switch; in combination with indicating means for manifesting the frequency to which said oscillator is tuned, wherein said indicating means comprises, (a) a selectable divider coupled to said oscillator and responsive to its signal frequency for dividing said signal frequency by a given integer determined by said band selector switch position, (b) a source of relatively stable frequency, (c) means coupled to said source for dividing said relatively stable frequency to obtain a plurality of stable timing waveshapes selectable in accordance with said selector switch position, (d) logic means coupled to said selectable divider and said means for dividing said stable frequency to provide at an output a group of pulses having a number determined both by said selected timing waveshape and said divided signal frequency, and (e) further means coupled to said output of said logic means and responsive to said number of pulses for providing a digital indication having a fixed number of digits independent of said oscillator's frequency but corresponding within a given number of significant places to said oscillator's frequency.

8. The oscillator according to claim 7 wherein said selectable divider comprises means for dividing said oscillator frequency by a factor of $2n$, where $n$ is a positive integer.

9. The oscillator according to claim 8 further comprising, a fixed divider circuit, coupled between said logic means and said further means, for dividing said number of pulses by a factor of $2n$ independent of said oscillator's frequency where $n$ is a positive integer.

10. The oscillator according to claim 9 further comprising, (a) a range select indicating means coupled to said band select switch and operable thereby to indicate a frequency range, and (b) a decimal point location indicating means coupled to said band select switch and operable thereby to indicate proper separation of said fixed number of digits to correspond to a given number of significant places indicative of said oscillator frequency.

11. Apparatus for displaying the frequency of a band switched oscillator on a given display means capable of displaying, with an accuracy of the same given number of significant digits, independent of the band in which said frequency exists, comprising, (a) first means coupled to said oscillator, for translating the frequency thereof to a second lower frequency, according to the setting of said band switch, (b) a source of relatively stable frequency, (c) second means coupled to said source for dividing said stable frequency to provide a plurality of lower stable frequency signals, one of which is selected according to said band, (d) third means coupled to said first and second means for providing a number of pulses for a duration determined by said selected lower stable frequency signal, and in accordance with said translated second lower frequency, whereby said number of pulses is always a measure of said oscillator frequency, and (e) logic means coupled to said third means for storing said number of pulses in digital form with said accuracy of said same given number of significant digits always determined according to said number of pulses, and independent of the band in which said frequency exists.

References Cited

UNITED STATES PATENTS

| | | | |
|---|---|---|---|
| 3,244,983 | 4/1966 | Ertman | 331—64 X |
| 3,413,565 | 11/1968 | Babany et al. | 331—18 |

ROY LAKE, Primary Examiner

S. H. GRIMM, Assistant Examiner

U.S. Cl. X.R.

331—64; 324—78; 325—455